United States Patent [19]
Bashaw et al.

[11] Patent Number: 5,729,364
[45] Date of Patent: Mar. 17, 1998

[54] ION AND IMPURITY CONCENTRATION OPTIMIZATION IN PHOTOREFRACTIVE MEDIA FOR DYNAMIC AND FIXED HOLOGRAPHY

[75] Inventors: Matthew C. Bashaw, Menlo Park; John F. Heanue, San Mateo; Lambertus Hesselink, Woodside, all of Calif.

[73] Assignee: The Board of Trustees of the Leland Stanford Junior University, Palo Alto, Calif.

[21] Appl. No.: 676,010

[22] Filed: Jul. 5, 1996

[51] Int. Cl.⁶ .................... G03H 1/28; G03H 1/04; G03H 1/18
[52] U.S. Cl. ................... 359/7; 359/3; 252/584; 252/582
[58] Field of Search .................... 359/3, 4, 7 D, 359/11, 22, 24; 369/103; 252/584, 582

[56] References Cited

U.S. PATENT DOCUMENTS

| | | |
|---|---|---|
| 3,799,642 | 3/1974 | Phillips et al. ............... 359/7 |
| 3,933,504 | 1/1976 | Phillips et al. ............... 359/7 |
| 3,997,350 | 12/1976 | Ikeo et al. .................... 359/7 |
| 5,335,098 | 8/1994 | Leyva et al. ................ 359/22 |
| 5,440,669 | 8/1995 | Rakuljic et al. ............. 359/22 |
| 5,493,628 | 2/1996 | Lawandy ..................... 359/7 |

*Primary Examiner*—Jon W. Henry
*Attorney, Agent, or Firm*—Lumen Intellectual Property Services

[57] ABSTRACT

Ionic and impurity concentrations in a photorefractive holographic storage medium are optimized such that electronic and ionic Debye numbers match an expected grating wave number K, at fixing and recording temperatures, respectively. Simultaneous and sequential recording and fixing are evaluated. The photovoltaic effect is reduced, subject to response time and absorption constraints, by matching reduced and oxidized impurity concentrations.

22 Claims, 3 Drawing Sheets

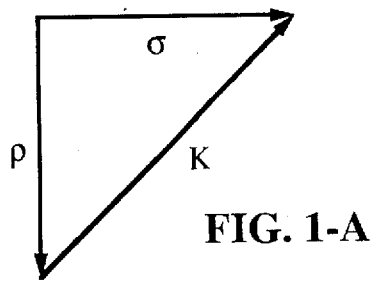
FIG. 1-A
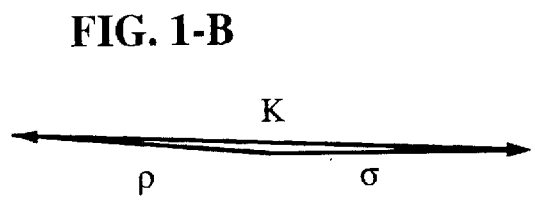
FIG. 1-B
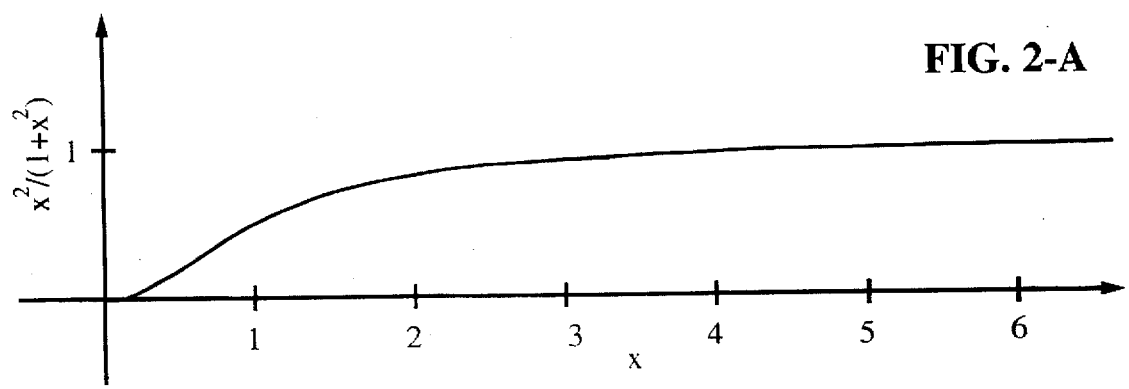
FIG. 2-A
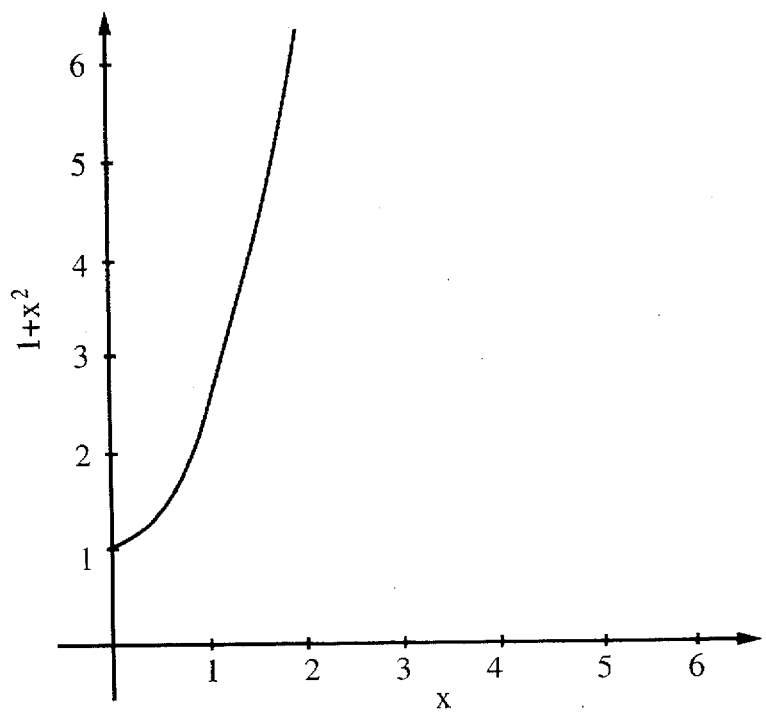
FIG. 2-B

FIG. 3
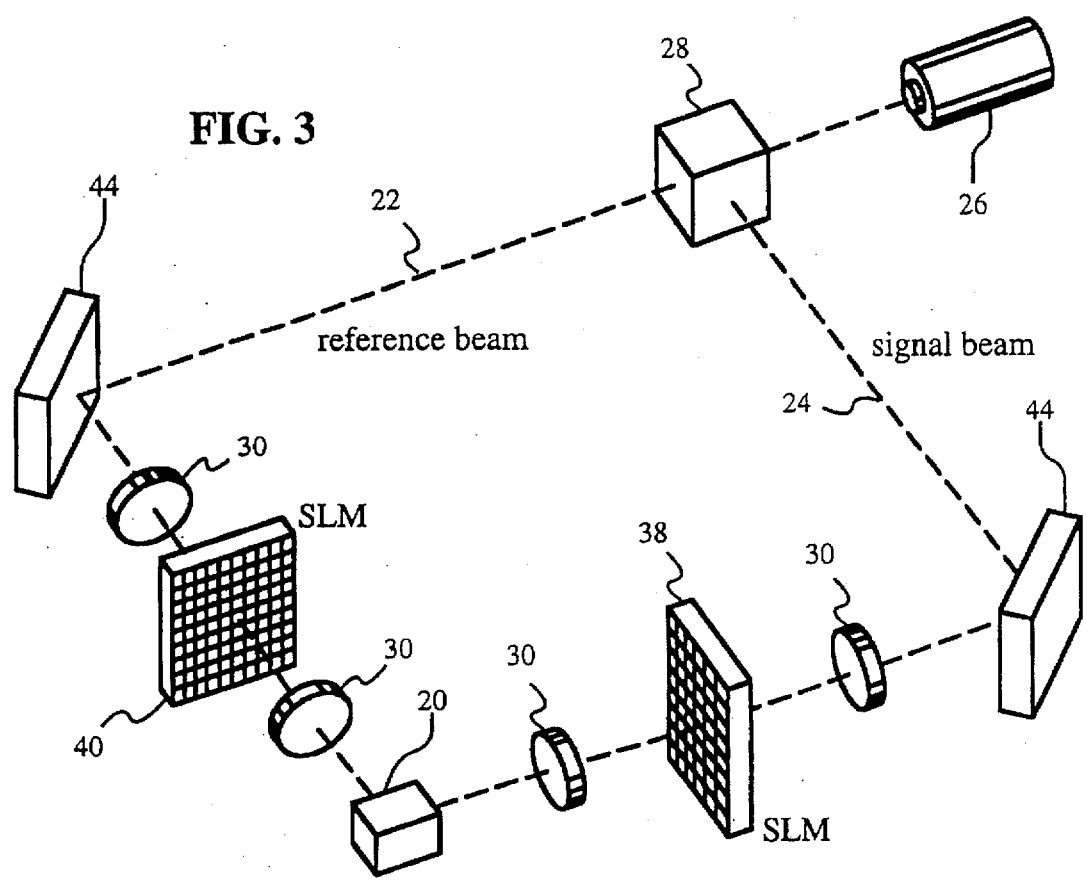
FIG. 4-A
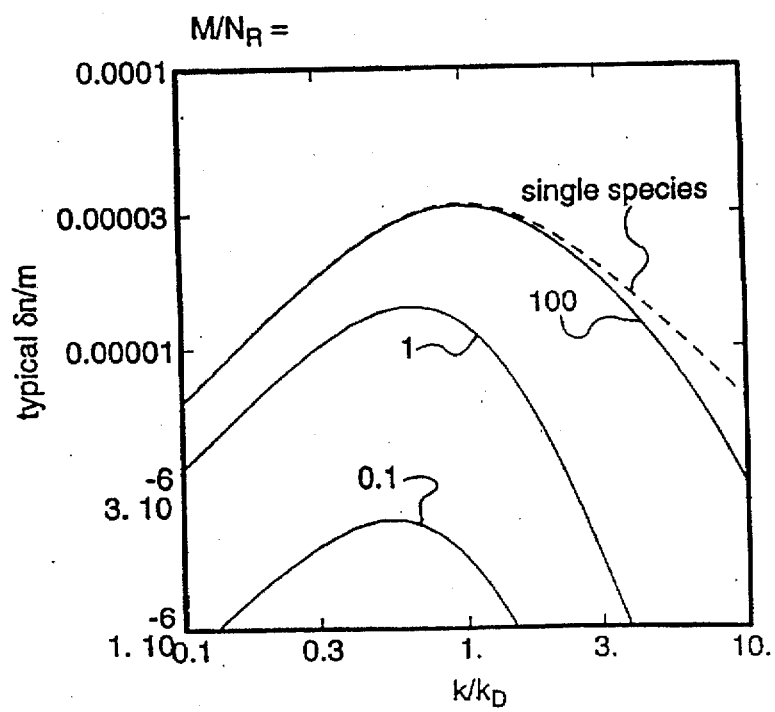

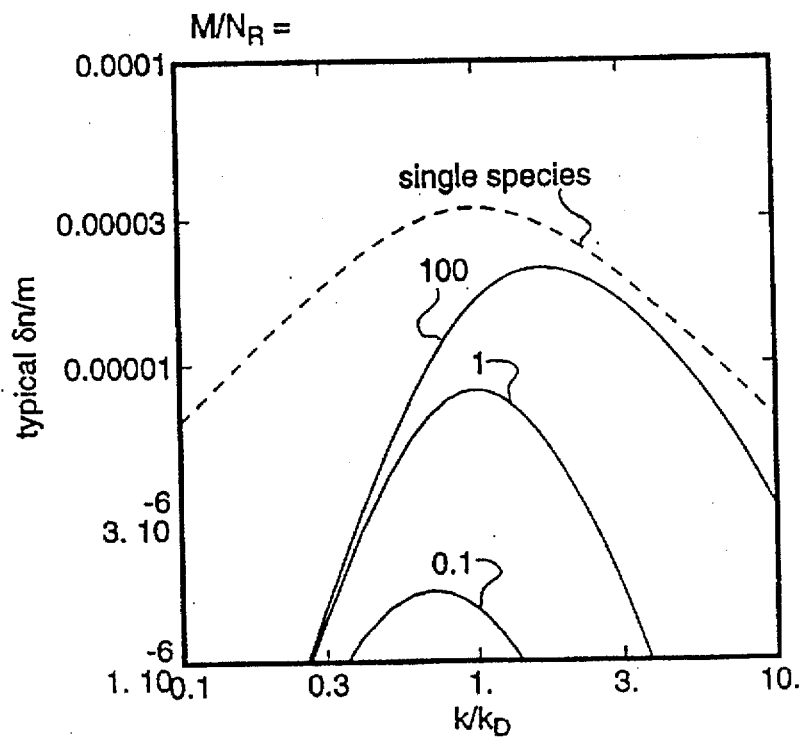
FIG. 4-B
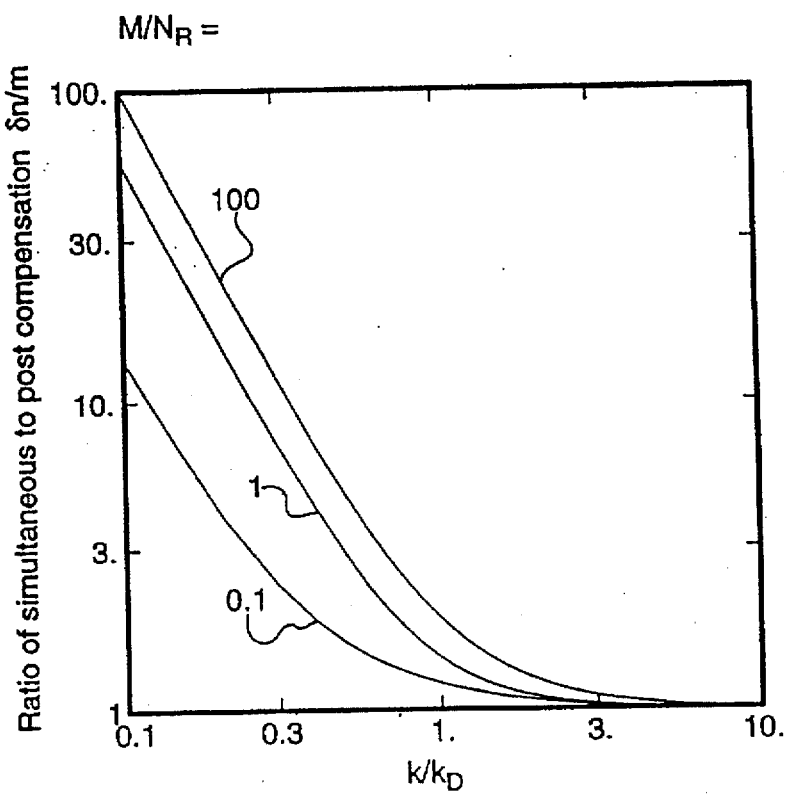
FIG. 4-C

ION AND IMPURITY CONCENTRATION OPTIMIZATION IN PHOTOREFRACTIVE MEDIA FOR DYNAMIC AND FIXED HOLOGRAPHY

This invention was made with government support under grant No. MDA972-94-2-0008, awarded by the ARPA-Industry-University Photorefractive Information Storage Materials (PRISM) Consortium. The government has certain rights in this invention.

FIELD OF THE INVENTION

The present invention relates to the field of holographic data storage, and in particular to a method of optimizing ion and impurity concentrations in photorefractive media for holographic storage.

BACKGROUND OF THE INVENTION

Since the development of off-axis holography in the 1960's, volume holography has been identified as a promising candidate for high density data storage. Theoretically, up to $10^{14}$ bits of information can be stored in 1 cm$^3$ of a volume holographic medium. In addition, holographic storage promises fast data transfer rates, estimated at over 1 Gb/s. For general information on holographic memory systems, see for example the articles by Heanue et al. in *Science* 265:749–752 (1994), Hong et al. in *Optical Engineering* 34(8): 2193–2203 (1995), and Psaltis and Mok in *Scientific American* 273(5): 70–78 (1995), or U.S. Pat. No. 4,927,220 (Hesselink et al.).

An important problem facing holographic storage is the decay of stored holograms with time. The diffraction efficiency of a stored grating decays upon the illumination of the medium during readout. Grating strength also decays in the dark, albeit at a slower rate than under illumination. Reliable implementation of holographic data storage systems for long term storage requires gratings that are durable in the dark and after some measure of illumination. Several hologram fixing approaches have been discussed, including thermal, electrical and optical fixing. Of these, thermal fixing is a particularly promising approach.

Principles and applications of fixing by thermally activated mobile ion compensation are discussed in many disclosures, including U.S. Pat. No. 5,335,098, and articles by Staebler et al. "Multiple Storage and Erasure of Fixed Holograms in Fe-Doped LiNbO$_3$" in *Appl. Phys. Lett.* 26:182 (1975), Carrascosa and Agullo-Lopez "Theoretical Modeling of the Fixing and Developing of Holographic Gratings in LiNbO$_3$" in *J. Opt. Soc. Am. B* 7:2317 (1990), Montemezzani et al. "Photorefractive Charge Compensation at Elevated Temperatures and Application to KNbO$_3$" in *J. Opt. Soc. Am. B* 10:171–185 (1993), and Yariv et al. "Hologram Fixing, Readout, and Storage Dynamics in Photorefractive Materials" in *Opt. Lett.* 20:1334–1336 (1995). The above-mentioned articles are incorporated herein by reference.

In U.S. Pat. No. 5,440,669, incorporated herein by reference, Rakuljic et al. describe a fixing method using thermally activated mobile ion compensation. A crystal is heated, either after or during the recording of a hologram, to a temperature at which ions within the crystal become mobile. The ions redistribute themselves so as to neutralize the recorded electronic grating. The crystal is then cooled to room temperature, and the electronic grating is removed by illumination ("developing"). Since the ions are relatively immobile at room temperature, the ionic grating is fixed, or meta-stable. The ionic grating then contains the information originally stored in the electronic grating.

There are two important requirements for a fixing approach: that the fixing do not result in a significant loss in diffraction efficiency, and that the fixed holograms be stable over a long time period. The importance of these requirements is recognized in the prior art. Prior disclosures, however, do not adequately address medium property optimization in light of efficiency and durability. Moreover, the prior art does not adequately discuss medium parameter optimization for non-fixed storage.

Another challenge facing holographic storage in commonly used photorefractive media is noise resulting from the photovoltaic effect. No adequate medium optimization techniques for reducing noise due to the photovoltaic effect have been devised.

OBJECTS AND ADVANTAGES OF THE INVENTION

In light of the above, it is a primary object of the present invention to provide a method of optimizing medium properties for holographic storage in light of efficiency, durability and noise requirements. It is another object of this invention to provide a method of optimizing medium properties for fixing in holographic systems. It is a further object of this invention to provide a simultaneous optimization of fixing efficiency and durability. It is yet another object of this invention to provide a method of photovoltaic effect minimization leading to improved noise performance. It is still another object of this invention to provide an apparatus and a holographic storage medium with improved efficiency, durability and noise performance.

SUMMARY OF THE INVENTION

These objects and advantages are attained with a method of storing a holographic grating in a medium. The grating is formed by the interference between a reference beam and a signal beam incident on the medium. The medium has an ion density M, and is characterized at a fixing temperature $T_f$ by an ionic Debye number $k_{Di}(M,T_f)$. The ion density M is chosen such that $k_{Di}(M,T_f)$ is larger than a predetermined threshold Th=K/10, where K is an expected grating wave number. The grating wave number K is on the order of the wave number of light used for storage.

Preferably, $k_{Di}(M,T_f)$ is within an order of magnitude of K. More preferably, $k_{Di}(M,T_f)$ is within a factor of two of K. Even more preferably, $k_{Di}(M,T_f)$ is substantially identical to K.

The medium also has an effective impurity density $N_R=N°N^*/N$, where N is the density of photorefractive impurities, N° plus N*, and is characterized at a recording temperature $T_r$ by an electronic Debye number $k_{De}(N_R,T_r)$. Preferably, the effective impurity concentration is chosen such that $k_{De}(N_R,T_r)$ is larger than Th. More preferably, $k_{De}(N_R,T_r)$ is within a factor of two of K.

The effective impurity density $N_R$ depends on a density of oxidized impurities N° and on a density of reduced impurities N*. Preferably, N* and N° are chosen such that they are within an order of magnitude of each other.

In sequential compensation, the recording temperature $T_r$ is different from the firing temperature $T_f$. Furthermore, in a preferred embodiment the recording temperature $T_r$ is substantially identical to an operating temperature $T_o$.

In simultaneous compensation, the grating is stored at a temperature $T_r$ at which an ionic conductivity, or an ionic mobility, is larger than at $T_o$. Preferably, $T_f=T_r$.

The present invention further provides a method of storing a grating wherein the electronic Debye number $k_{De}(N_R, T_r)$ is larger than Th. To minimize the photovoltaic effect (when it exists) under several other constraints, it is preferred that $N^*$ be chosen to be within an order of magnitude of $N°$. More preferably, $N^*$ is chosen to be within a factor of two of $N°$.

An apparatus of the present invention comprises a holographic storage medium having an ion density M, and characterized at a fixing temperature $T_f$ by an ionic Debye number $k_{Di}(M,T_f)$. The ion density M is chosen such that $k_{Di}(M,T_f)$ is larger than a predetermined threshold Th=K/10, where K is a grating wave number of a grating caused by the interference of a signal beam and a reference beam incident on the medium at a recording temperature $T_r$.

An apparatus of the present invention is suited for the implementation of a method of the present invention.

Methods of producing media while optimizing an ionic density M, and/or an effective impurity density $N_R$, are also disclosed. The densities are chosen such that the corresponding Debye numbers are within an order of magnitude of K.

A holographic storage medium comprising a photorefractive material is further disclosed. The medium has an ion density M, and is characterized at a fixing temperature $T_f$ by an ionic Debye number $k_{Di}(M,T_f)$. The ion density M is chosen such that $k_{Di}(M,T_f)$ is within an order of magnitude of an expected grating wave number K. More preferably, $k_{Di}(M,T_f)$ is substantially equal to K.

The medium also has an effective impurity density $N_R$, and is characterized at a recording temperature $T_r$ by an electronic Debye number $k_{De}(N_R,T_r)$. Preferably, the effective impurity concentration is chosen such that $k_{De}(N_R,T_r)$ is within an order of magnitude of K. More preferably, $k_{De}(N_R,T_r)$ is within a factor of two of K.

Suitable photorefractive materials include lithium niobate, strontium barium niobate, lithium tantalate, barium titanate, and bismuth silicon oxide. Suitable impurities include photoexcitable elements, photoexcitable metals with at least two valence states, photoexcitable transition metals with at least two valence states, and photoexcitable rare earth metals with at least two valence states.

DESCRIPTION OF THE FIGURES

FIG. 1-A illustrates the relationship between the wave number K of a stored grating and the wave number of light used, in a perpendicular geometry.

FIG. 1-B illustrates the relationship between the wave number K of a stored grating and the wave number of light used, in a counterpropagating geometry.

FIG. 2-A shows qualitatively the dependence of a diffraction efficiency on the ratio $K_{Di}/K$, for a fixed $K_{De}$, according to the present invention.

FIG. 2-B shows qualitatively the dependence of a decay rate on the ratio $K_{Di}/K$, for a fixed hologram, according to the present invention.

FIG. 3 depicts a holographic storage apparatus of the present invention.

FIG. 4-A shows diffraction efficiencies as a function of $K/K_{Di}$ for simultaneous writing and fixing.

FIG. 4-B shows diffraction efficiencies as a function of $K/K_{Di}$ for sequential writing and fixing FIG. 4-C shows a comparison of the approaches illustrated in FIGS. 4-A and 4-B.

DETAILED DESCRIPTION

The present invention allows optimization of medium parameters such as ion and impurity densities in light of both efficiency and durability requirements. Briefly, hologram durability generally decreases with ion concentration. At the same time, the requirement of efficient recording places a lower bound on the allowed ion concentration at a given frequency. Ionic and impurity densities corresponding to electronic and ionic Debye numbers on the orders of a grating wave number K are optimal.

In a holographic medium data is stored as an interference pattern, or grating, produced by an interference between a signal beam and a reference beam within the medium. In general, a given hologram contains a spectrum of frequencies, depending on the data stored and the modulation (if any) of the reference beam. A grating can be approximately characterized, however, by a grating wave vector K determined solely by the wavelength of light used and by system geometry.

FIG. 1-A illustrates a grating wave vector K for a perpendicular geometry, while FIG. 1-B shows K in a counterpropagating geometry. A reference wave vector ρ characterizes the reference beam, while a signal wave vector σ represents collectively components of the signal beam. The magnitudes of ρ and σ are determined by the wavelength of light used, and are equal to $2\pi/\lambda$. The grating wave vector K is equal to ρ−σ, and has a magnitude on the order of $2\pi/\lambda$. In the perpendicular geometry commonly used with angular and phase-code multiplexing, the grating wave number K (the magnitude of K) is approximately $\rho\sqrt{2}$, while in the counterpropagating geometry commonly used with wavelength multiplexing, K=2ρ.

Hologram formation in photorefractive media is a result of the photoexcitation and redistribution of electrons. In a medium containing a mobile ionic species, the ions redistribute to screen a formed electronic grating. The ionic and electronic systems then represent two complementary constituent gratings that are out of phase. If the medium is brought to a condition under which the ions are relatively immobile, the ionic grating becomes fixed, or meta-stable. The decay time for the ionic grating can be made to be much longer than for an electronic grating.

Once the ionic grating is fixed, the screening electronic grating is erased by a developing (or revelation) process. The developing process, typically consisting of illuminating the medium for a given period of time, reveals the ionic grating and allows readout of the data stored in the ionic grating.

The gratings are recorded at a temperature $T_r$. In a preferred implementation of fixing by mobile ion compensation, $T_r$ is on the order of an operating temperature $T_o$. An operating temperature $T_o$ is any temperature at which the medium is expected to operate. For example, $T_r$ and $T_o$ can be equal to room temperature. The medium is brought to a fixing temperature $T_f$ characterized by a greater ionic conductivity than $T_r$, and is then cooled to $T_o$.

In a second preferred implementation, the recording temperature $T_r$ is on the order of (or equal to) $T_f$, and is different from $T_o$. That is, the grating is recorded at a temperature characterized by a higher ionic conductivity than $T_o$. The ionic and electronic gratings are mutually screened, and form simultaneously in an ambipolar process. The mutual screening enhances the strength of the constituent gratings without substantially increasing the net grating. Following a return of the medium to $T_o$ and revelation, the stronger ionic grating results in a stronger net grating.

Recording holograms at a temperature substantially different from the operating temperature is hindered by several effects, such as the temperature dependence of the index of refraction and anisotropic thermal expansion. In a volume Fourier holographic arrangement frequently used for data storage, such effects result in an inability to match the reference beam to the entire continuum of grating vectors representing a hologram, and consequently in an inability to reconstruct the entire field of view of an image. It is important, therefore, to take into account both the diffraction strength advantages, and the image quality disadvantages, of simultaneous writing and fixing.

Detailed charge transport models are disclosed in the above-incorporated articles, and are not discussed here in detail. A more theoretical treatment can be found in the Theory section below. For more information on a popular closed form solution to electron transport equations in photorefractive media, see the article by Kukhtarev "Kinetics of Hologram Recording and Erasure in Electrooptic Crystals" in *Sov. Tech. Phys. Lett.* 2:438 (1976).

In a photorefractive medium dominated by diffusion, electronic transport is characterized by an electronic Debye number $k_{De}$ $$k_{De} = \sqrt{\frac{e^2 N_R}{\epsilon \epsilon_0 k_B T}} \quad [1]$$

where e is the charge of the electron, $k_B$ is the Boltzmann constant, $\epsilon_0$ is the permittivity of free space, and T is the material temperature. Relevant material parameters are the dielectric constant $\epsilon$, the density of photorefractive impurities N, the density of oxidized impurities $N^\circ$, the density of reduced impurities $N^*$, and an effective impurity density $N_R = N^\circ N^*/N$.

Similarly, ion transport is characterized by an ionic Debye number $k_{Di}$ $$k_{Di} = \sqrt{\frac{p^2 M}{\epsilon \epsilon_0 k_B T}} \quad [2]$$

where p is the ion charge and M is the ionic density.

Consider a grating formed by a single charge species (e.g. electrons) whose density corresponds to a Debye number $k_D$. The Debye number $k_D$ is a measure of the number of carriers available for grating formation. Larger grating numbers (higher frequencies) require larger carrier densities, for a given grating strength. A hologram characterized by a wave number $K > k_D$ is limited in strength by the ionic or effective impurity concentration, while a hologram with $K < k_D$ is limited in lifetime by diffusion. The strength of a grating is greatest when $K_D > k$. Preferably, K is within an order of magnitude of $k_D$.

Consider now a grating recorded at a recording temperature $T_r$, and fixed at a fixing temperature $T_f \neq T_r$. The closed circuit initial index perturbation of such a grating can be shown to vary as $$\delta n \propto \frac{\left(\frac{K}{k_{DE}}\right)^2 - \frac{iK}{k_E} - \frac{iK}{k_P}}{1 + \left(\frac{K}{k_{De}}\right)^2 - \frac{iK}{k_E} - \frac{iK}{k_P}} \times \frac{1}{1 + \left(\frac{K}{k_{Di}}\right)^2} \times \frac{KV_T - iE_0 - IE_{ph}}{1 + \left(\frac{K}{k_{De}}\right)^2 - \frac{iK}{k_E} - \frac{iK}{k_P}}, \quad [3]$$

where
$k_E$ is the characteristic field number $eN_R/\epsilon\epsilon_0 E_0$,
$k_P$ is the characteristic photovoltaic number $(\mu e^2/\epsilon\epsilon_0 \kappa\gamma)(N^*/N^\circ)$,
$\kappa$ is the photovoltaic coefficient,
$\gamma$ is the recombination coefficient,
$V_T$ is the diffusion potential $k_B T/e$,
$E_0$ (if any) is a field applied in the direction of the grating,
$E_{ph}$ is the photovoltaic field $\kappa\gamma N^\circ/e\mu_e$,
$\mu_e$ is the electron mobility
and where $K_{De}$ is evaluated at the recording temperature $T_r$, and $K_{Di}$ is evaluated at the fixing temperature $T_f$.

For clarity of presentation, it is useful to consider the case in which there is no applied electric field and no photovoltaic effect. Relation [3] then becomes $$\delta n \propto \frac{\left(\frac{K}{k_{De}}\right)^2}{1 + \left(\frac{K}{k_{De}}\right)^2} \times \frac{1}{1 + \left(\frac{K}{k_{Di}}\right)^2} \times \frac{KV_T}{1 + \left(\frac{K}{K_{De}}\right)^2}. \quad [4]$$

The first and third terms in equation [4] depend on $k_{De}$, while the second term depends on $k_{Di}$. For a fixed value of $k_{De}$, the strength of a revealed grating fixed after recording increases with $k_{Di}/K$. A qualitative shape of the function $(1+1/x^2)^{-1}$ is shown in FIG. 2-A, where $x = k_{Di}/K$. As illustrated in the figure, increasing $K_{Di}$ beyond an expected value of K does not result in a substantial increase in diffraction efficiency.

It is therefore desirable to have $K_{Di}$ be larger than a predetermined threshold $Th = Th(K)$. Preferably, $Th(K)$ is K/10 or larger. That is, due to intensity constraints, it is preferred that $K_{Di}/K$ be larger then at least $10^{-1}$. More preferably, $K_{Di}$ is within a factor of two of K. Even more preferably, $K_{Di}/K$ is approximately 1. If $K_{Di}$ is small relative to K (e.g. $K_{Di} < K/10$), the grating intensity is severely limited by the availability of ions.

For a grating written and fixed at the same temperature ($T_r = T_f$), and revealed at the operating temperature $T_o$, the closed-circuit initial index perturbation can be shown to have a form $$\delta n \propto \frac{\left(\frac{K}{k_{De}(T_o)}\right)^2 - \frac{iK}{k_E} - \frac{iK}{k_P}}{1 + \left(\frac{K}{k_{De}(T_o)}\right)^2 - \frac{iK}{k_E} - \frac{iK}{k_P}} \times \frac{1}{1 + \left(\frac{K}{k_{Di}}\right)^2} \times \frac{KV_T - iE_{ph}}{\left[1 + \left(\frac{k_{Di}}{K}\right)^2\right]^{-1} + \left[\frac{K}{k_{De}(T_f)}\right]^2 - \frac{iK}{k_P}} \quad [6]$$

where $k_{Di}$ is evaluated at $T_f$, $k_{De}(T_o)$ is the electronic Debye number evaluated at $T_o$, and $k_{De}(T_f)$ is the electronic Debye number evaluated at $T_f$. In the absence of a significant photovoltaic effect and an applied electric field, equation [6] simplifies to $$\delta n \propto \frac{\left(\frac{K}{k_{De}(T_o)}\right)^2}{1 + \left(\frac{K}{k_{De}(T_o)}\right)^2} \times \frac{1}{1 + \left(\frac{K}{k_{Di}}\right)^2} \times \frac{KV_T}{\left[1 + \left(\frac{k_{Di}}{K}\right)^2\right]^{-1} + \left[\frac{K}{k_{De}(T_f)}\right]^2}. \quad [7]$$

While a large $K_{Di}/K$ ensures a high initial grating strength for a given value of $K_{De}$, a high ion density leads to fast ionic grating decay. The time constant for ionic grating decay can be shown to vary as $$\Gamma = \Gamma_{dii}\left[1+\left(\frac{K}{K_{Di}}\right)^2\right] \propto M\left(1+b\frac{K^2}{M}\right) \quad [8]$$

where
$\Gamma_{dii}$ is the dielectric relaxation rate $e\mu_i M/\epsilon\epsilon_o$,
$\mu_i$ is the ionic mobility,
and b is a constant (see equation [2]).
The rate in equation, [8] is valid when ionic and electronic relaxation are decoupled. If $k_{Di} \gg K$, $k_{De} \gg K$, ionic decay depends on electronic screening.

For a sufficiently high ion concentration M, the erasure rate is proportional to M, while for small M the erasure rate is constant. The function $x^2(1+x^{-2})$ is shown qualitatively in FIG. 2-B, where $x=K_{Di}/K$. As illustrated, the grating decay time increases precipitously for $K_{Di} > K$. Thus, it is preferred that $K_{Di}$ be within an order of magnitude of K. More preferably, $K_{Di}$ is chosen to be within a factor of two of K.

An appropriate choice of M, or alternatively of $K_{Di}/K$, depends on system requirements. For a database used for long-term (tens of years) storage, a large time constant is required. A smaller time constant may be sufficient for a frequently-updated database.

According to the present invention, it is further preferred that the electronic Debye number $K_{De}$ be matched to the expected grating wave number K. The condition that $K_{De}$ be higher than a threshold Th(K)=K/10 further ensures a minimization of grating vector dispersion. More preferably, $K_{De}$ is chosen to be within an order of magnitude of K.

The photovoltaic effect, when present, increases index perturbations and can pose a significant challenge because it results in index perturbations for macroscopic features. Such perturbations typically result in beam degradation, as described for example in the article by Ashkin et al. in Appl. Phys. Lett. 9:72 (1966). Macroscopic perturbations accumulate for multiple exposures and do not reduce inversely with the number of holograms. Beam degradation of this type depends on the structure of the illuminating signal and reference beams and must be quantified for a particular holographic arrangement.

It is generally desirable to reduce the photovoltaic effect to the extent possible without compromising grating strength in the preferred geometries. The photovoltaic electric field is proportional to $N^o$. On the other hand, fast response time is also desired, for which it is desirable to maximize $N^*/N^o$. Furthermore, absorption, which is proportional to $N^*$, must be kept to a minimum. Each of these competing requirements must be balanced with the overall performance requirements of a particular system. It is therefore preferred that appropriate oxidation and reduction conditions be chosen such that $N^o$ be within an order of magnitude of $N^*$. More preferably, $N^*$ is within a factor of two of $N^o$.

FIG. 3 shows a phase-code multiplexing implementation of an apparatus of the present invention. As is evident to the skilled artisan, other multiplexing approaches such as angular, wavelength and spatial multiplexing are suitable for use with the present invention.

A storage medium 20 is illuminated by a reference beam 22 and by a signal beam 24. A laser 26 generated a beam that is split by a beam splitter 28. Lenses 30 and mirrors 44 are used to spatially manipulate and transform the two beams, as is well known in the art. An amplitude spatial light modulator 38 encodes data pages into signal beam 24, while a phase spatial light modulator 40 encodes orthogonal phase functions into reference beam 22. Preferably, SLMs 38, 40, and lenses 30 are placed in a Fourier arrangement. A thermal fixing means (not shown) is preferably in thermal contact with medium 20 and is used to establish desired temperatures within medium 20.

Ways of establishing desired impurity concentrations, and of manipulating oxidation conditions for controlling densities of oxidized and reduced impurities are well known in the art. Ways to control ion concentrations in photorefractive media are also known in the art. For example, in LiNbO₃, in which H⁺ is a carrier ion, the ion density M can be controlled by manipulation of humidity during crystal growth.

The following examples are intended to illustrate the present invention, and should not be construed to limit the invention.

EXAMPLE 1

In perpendicular and reflection geometries used in holographic storage applications, typical grating wave numbers are on the order of 0.1 μm at visible wavelengths. In a high Curie temperature material such as lithium niobate, the condition $K=k_{De}$ corresponds to an effective impurity density on the order of $10^{17}$ cm$^{-3}$. In a low Curie temperature material such as barium titanate, due to the higher dielectric screening, the condition corresponds to a concentration on the order of $10^{19}$ cm$^{-3}$.

EXAMPLE 2

Simultaneous writing and fixing, and sequential writing and fixing were evaluated. FIGS. 4-A, 4-B and 4-C show relative index perturbations δn/m for quasi-stabilized gratings as a function of $k/k_{Di}$ for simple diffusion transport with mobile ions, for several concentrations of ions $M/N_R$. The dashed lines represent unstabilized electron-only transport at room temperature. The numbers marking the curves refer to $M/N_R$ values.

FIG. 4-A shows a typical dependence of a revealed diffraction efficiency on the ratio $K/k_{Di}$ for different relationships between M and $N_R$. The Figure also shows the dependence of the diffraction efficiency of a single-species grating on $K/k_{Di}$ (dashed line). The graph shows a typical index perturbation at $T_o$ after simultaneous writing and fixing at $T_f=T_r$. When the ion concentration M is significantly greater than the effective impurity concentration $N_R$, the strength of the revealed grating approaches the initial strength of a grating written by electron transport only. Note that at the Debye number ($K \equiv K_{Di}$) and for $M=N_R$ (a preferred embodiment of the present invention), the strength of the revealed grating is comparable to the single-species strength.

FIG. 4-B shows grating behaviors for recording at $T_r$, and subsequent fixing at $T_f \neq T_r$. The measurements are performed at $T_o=T_r$. When the ion concentration M is high, the strength of the revealed grating approaches the initial strength of the single-species grating. At the Debye number ($K \equiv K_{Di}$) and for $M=N_R$, the revealed grating is somewhat lower than that observed for simultaneous writing and fixing, but is comparable to the single-species strength.

FIG. 4-C shows a comparison of diffraction efficiencies for simultaneous writing and fixing, and for sequential writing and fixing. At high grating wave numbers, the two approaches yield similar results. The ratios of gratings for simultaneous compensation to sequential compensation are shown.

EXTENSIONS

It will be clear to one skilled in the art that the above embodiments may be altered in many ways without departing from the scope of the invention. For example, multiple ionic and/or impurity species may be used. Many different materials are available for storage. Fixing approaches other than thermal fixing suitable for use in the present invention. Holography applications other than data storage are well known in the art. Accordingly, the scope of the invention should be determined by the following claims and their legal equivalents.

What is claimed is:

1. A holographic recording method comprising the steps of:
   a) establishing a reference beam and a signal beam incident on a photorefractive holographic storage medium at a recording temperature $T_r$, for recording in said medium a holographic grating characterized by a grating wave number K, wherein
   said grating wave number K is substantially equal to an electronic Debye number $k_{De}(N_R,T_r)$ characterizing said medium, wherein $N_R$ is an effective impurity density of said medium, and
   a density of reduced impurities $N^*$ in said medium is substantially equal to a density of oxidized impurities $N^°$ in said medium; and
   b) fixing said grating in said medium by establishing a fixing temperature $T_f$ within said medium.

2. The method of claim 1 wherein said grating wave number K is substantially equal to an ionic Debye number $k_{Di}(M,T_f)$ characterizing said medium, wherein M is a mobile ion density of said medium.

3. The method of claim 1 wherein said recording temperature $T_r$ is distinct from said fixing temperature $T_f$ such that an ionic conductivity of said medium at said recording temperature $T_r$ is lower than an ionic conductivity of said medium at said fixing temperature $T_f$, and said step of fixing said grating is performed after said step of recording said grating.

4. The method of claim 1 wherein said recording temperature $T_r$ is substantially equal to said fixing temperature $T_f$, and said step of fixing said grating is performed simultaneously with said step of recording said grating.

5. The method of claim 1 wherein said reference beam is substantially perpendicular to said signal beam.

6. The method of claim 1 wherein said reduced and oxidized impurities comprise a transition metal.

7. The method of claim 1 wherein said reduced and oxidized impurities comprise a rare earth metal.

8. The method of claim 1 wherein said medium comprises lithium niobate.

9. The method of claim 1 wherein said medium comprises a material selected from strontium barium niobate, lithium tantalate, barium titanate, and bismuth silicon oxide.

10. A holographic recording apparatus comprising:
    a) a photorefractive holographic storage medium susceptible to the photovoltaic effect and characterized by an electronic Debye number $k_{De}(N_R,T_r)$, wherein $N_R$ is an effective impurity density of said medium, and by a density of reduced impurities $N^*$ substantially equal to a density of oxidized impurities $N^°$;
    b) an optical system in optical communication with said medium, for establishing a reference beam and a signal beam incident on said medium at a recording temperature $T_r$, for recording in said medium a grating characterized by a grating wave number K substantially equal to said electronic Debye number $k_{De}(N_R,T_r)$; and
    c) a fixing system in thermal communication with said medium, for fixing said grating in said medium by establishing a fixing temperature $T_f$ within said medium.

11. The apparatus of claim 10 wherein said grating wave number K is substantially equal to an ionic Debye number $k_{Di}(M,T_f)$ characterizing said medium, wherein M is a mobile ion density of said medium.

12. The apparatus of claim 10 wherein said recording temperature $T_r$ is distinct from said fixing temperature $T_f$ such that an ionic conductivity of said medium at said recording temperature $T_r$ is lower than an ionic conductivity of said medium at said fixing temperature $T_f$, and wherein said fixing system establishes said fixing temperature $T_f$ within said medium after said grating is recorded in said medium.

13. The apparatus of claim 10 wherein said recording temperature $T_r$ is substantially equal to said fixing temperature $T_f$.

14. The apparatus of claim 10 wherein said reference beam is substantially perpendicular to said signal beam.

15. The apparatus of claim 10 wherein said reduced and oxidized impurities comprise a transition metal.

16. The apparatus of claim 10 wherein said reduced and oxidized impurities comprise a rare earth metal.

17. The apparatus of claim 10 wherein said medium comprises lithium niobate.

18. The apparatus of claim 10 wherein said medium comprises a material selected from strontium barium niobate, lithium tantalate, barium titanate, and bismuth silicon oxide.

19. A holographic recording method comprising the steps of:
    a) selecting a grating wave number K;
    b) growing a photorefractive holographic storage medium and controlling oxidation conditions within said medium such that an electronic Debye number $k_{De}(N_R,T_r)$ of said medium is substantially equal to said grating wave number K, wherein $N_R$ is an effective impurity density or said medium, and such that a density of reduced impurities $N^*$ in said medium is substantially equal to a density of oxidized impurities $N^°$ in said medium; and
    c) recording at a temperature $T_R$ a hologram characterized by said grating wave number K in said medium.

20. A holographic recording method comprising the steps of:
    a) establishing a reference beam incident on a photorefractive holographic storage medium susceptible to the photovoltaic effect and characterized by a density of reduced impurities $N^*$ substantially equal to a density of oxidized impurities $N^°$; and
    b) establishing a signal beam incident on said medium, for storing a grating characterized by a grating wave number K in said medium.

21. A holographic storage medium comprising a photorefractive material susceptible to the photovoltaic effect, wherein a density of reduced impurities $N^*$ within said material is substantially equal to a density of oxidized impurities $N^°$ within said material.

22. A method of producing a photorefractive holographic storage medium susceptible to the photovoltaic effect, comprising a step of controlling oxidation conditions within said medium such that a density of reduced impurities $N^*$ in said medium is substantially equal to a density of oxidized impurities $N^°$ in said medium.

* * * * *